United States Patent
Suzuki et al.

(10) Patent No.: US 7,166,959 B2
(45) Date of Patent: Jan. 23, 2007

(54) DISPLAY DEVICE HAVING MICRORESONATOR STRUCTURE

(75) Inventors: Koji Suzuki, Aichi (JP); Ryuji Nishikawa, Gifu (JP); Kiyoshi Yoneda, Mizuho (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 11/020,815

(22) Filed: Dec. 22, 2004

(65) Prior Publication Data

US 2005/0140277 A1 Jun. 30, 2005

(30) Foreign Application Priority Data

Dec. 26, 2003 (JP) ............... 2003-435823

(51) Int. Cl.
- H01J 1/62 (2006.01)
- H01J 63/04 (2006.01)
- H01J 1/64 (2006.01)
- H01J 1/70 (2006.01)

(52) U.S. Cl. ............... 313/504; 313/506; 313/505

(58) Field of Classification Search ........... 313/506, 313/505

See application file for complete search history.

(56) References Cited

U.S. PATENT DOCUMENTS

| | | | |
|---|---|---|---|
| 5,554,911 A | 9/1996 | Nakayama et al. ......... 313/503 |
| 5,757,126 A * | 5/1998 | Harvey et al. ............ 313/506 |
| 6,111,270 A | 8/2000 | Xu et al. | |
| 6,445,005 B1 | 9/2002 | Yamazaki et al. | |
| 6,505,901 B1 | 1/2003 | Fukuda | |
| 6,639,250 B1 | 10/2003 | Shimoda et al. | |
| 6,670,772 B1 | 12/2003 | Arnold et al. | |
| 6,710,541 B1 | 3/2004 | He et al. | |
| 6,737,800 B1 | 5/2004 | Winters et al. | |
| 6,841,803 B1 | 1/2005 | Aizawa et al. | |
| 6,906,457 B1 | 6/2005 | Song et al. | |
| 2002/0113548 A1 * | 8/2002 | Silvermail ............ 313/506 |

(Continued)

FOREIGN PATENT DOCUMENTS

| | | |
|---|---|---|
| EP | 0 615 401 | 9/1993 |
| JP | 6-275381 | 9/1994 |
| JP | 2003-187975 | 7/2003 |

OTHER PUBLICATIONS

"Elements Having Optical Cavity Structure"; Molecular Electronics and Bioelectronics in Third Seminar (1993) with partial English translation.

(Continued)

Primary Examiner—Mariceli Santiago
Assistant Examiner—Elizabeth Rielley
(74) Attorney, Agent, or Firm—Cantor Colburn LLP

(57) ABSTRACT

A display device includes a plurality of pixels and realizes a color display using emitted light of at least two wavelengths. Each pixel has a microresonator structure formed between a lower reflective film formed on a side near a substrate and an upper reflective film formed above the lower reflective film with an organic light emitting element layer therebetween. A conductive resonator spacer layer is provided between the lower reflective film and the organic light emitting element layer. Light obtained in the organic light emitting element layer is intensified by the microresonator structure in which the optical length is adjusted by the conductive resonator spacer layer and is emitted to the outside.

7 Claims, 8 Drawing Sheets

U.S. PATENT DOCUMENTS

2005/0040756 A1 2/2005 Winters et al.
2005/0067945 A1 3/2005 Nisbikawa et al.
2005/0067954 A1 3/2005 Nishikawa et al.
2005/0088085 A1 4/2005 Nishikawa et al.
2005/0099113 A1 5/2005 Yamada

OTHER PUBLICATIONS

Partial Translation of Sections 1, 2, 2.1 and 3 from "Study of Organic EL Materials and Devices From Basis to Frontier" from Molecular Electronics and Bioelectronics, Third meeting (1993) of Japan Society of Applied Physics Molecular Electronics and Bioelectronics Division, held on Dec. 16-17, 1993.

Copy of Korean Patent Laid-Open Publication No. 2003-2182, mailed Apr. 26, 2006, with its English Abstract and complete English translation.

Copy of Japanese Patent Laid-Open Publication No. Sho 63-148597, dated Jun. 21, 1998, with its full English translation.

Copy of Japanese Patent Laid-Open Publication No. 2001-217072, dated Aug. 10, 2001, with its English Abstract.

* cited by examiner

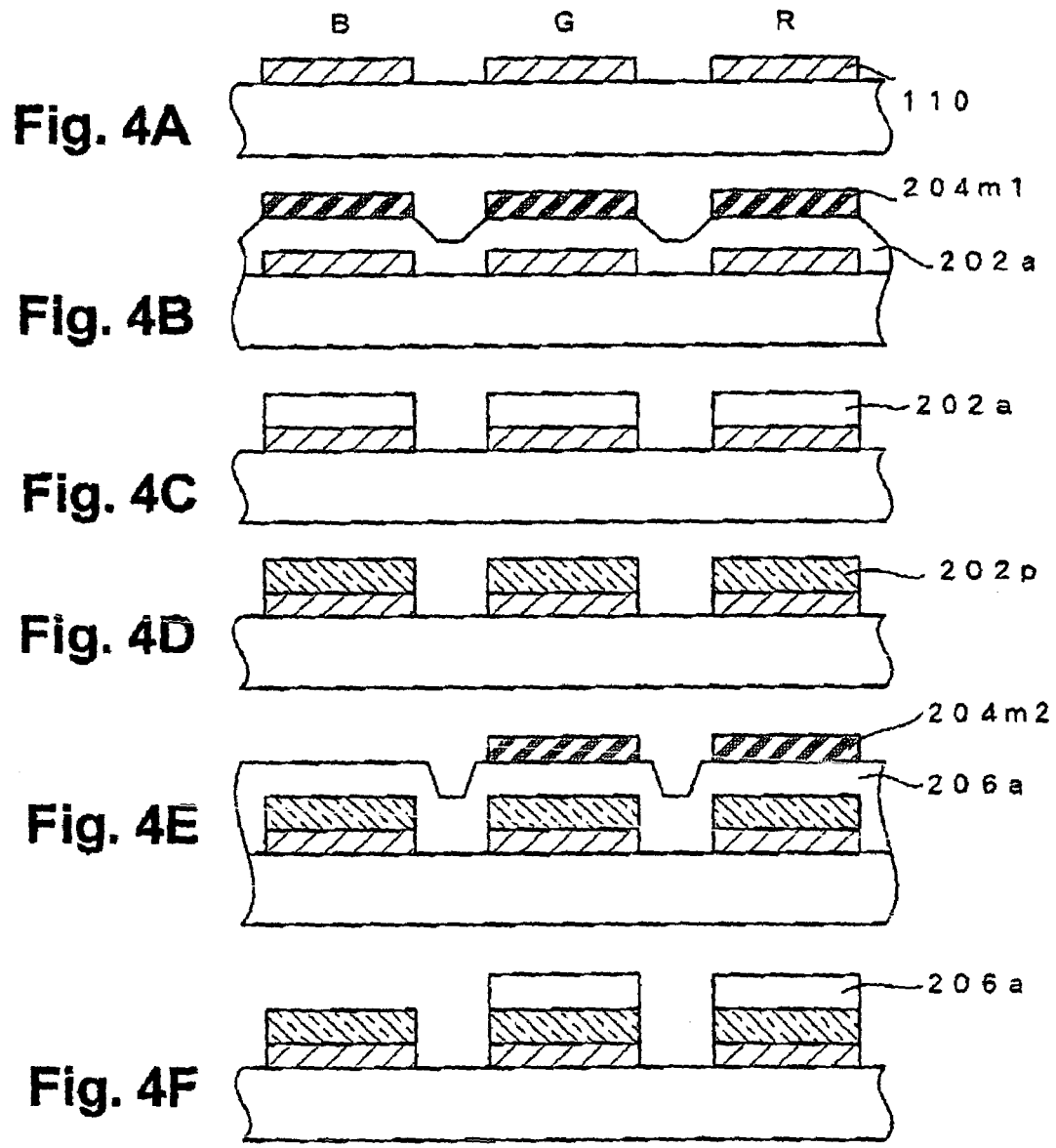

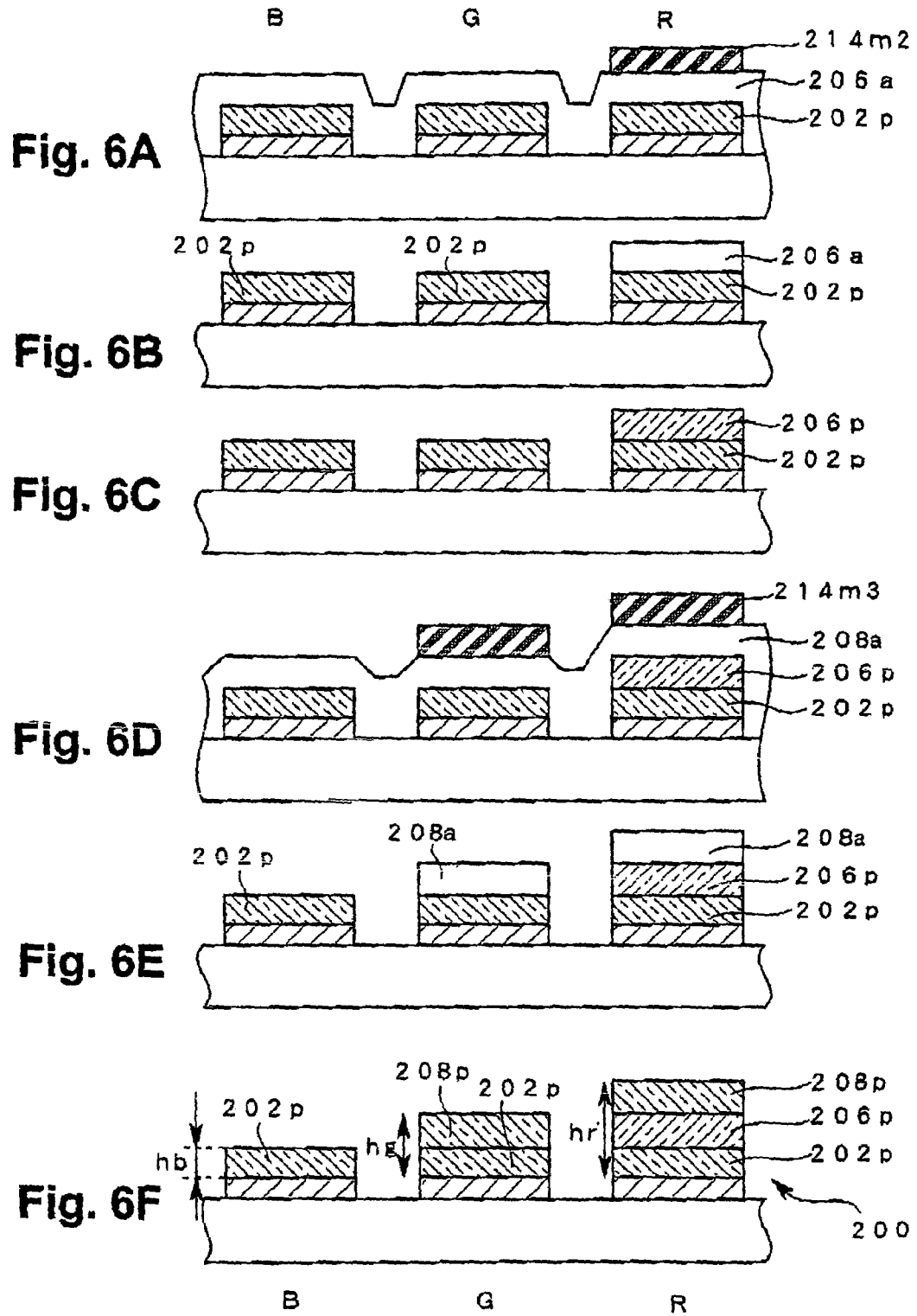

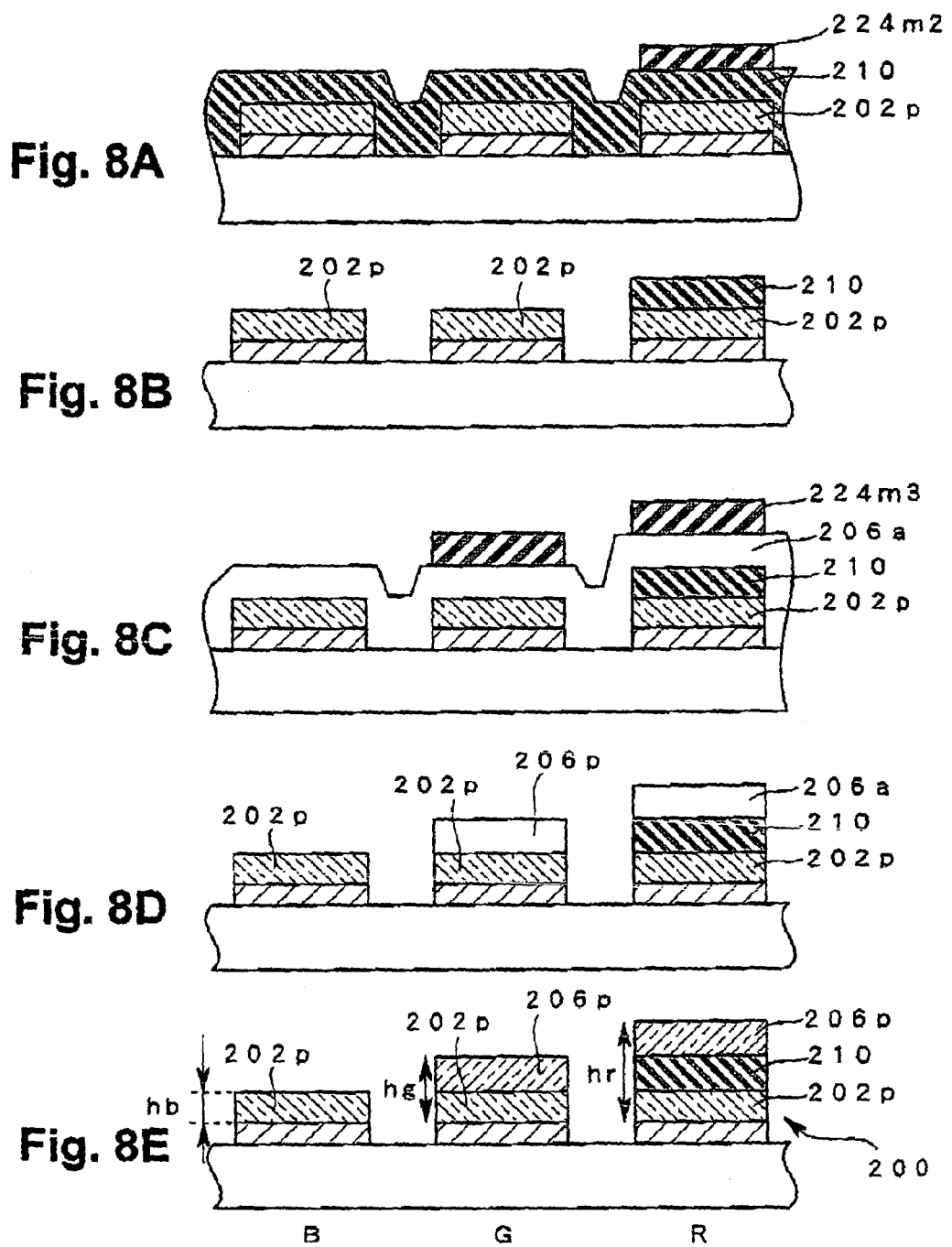

DISPLAY DEVICE HAVING MICRORESONATOR STRUCTURE

CROSS-REFERENCE TO RELATED APPLICATIONS

The entire disclosure of Japanese Patent Application No. 2003-435823 including specification, claims, drawings and abstract is incorporated herein by reference.

BACKGROUND OF THE INVENTION

1. Field of the Invention

The present invention relates to a display device and, in particular, to a color display device having a microresonator (microcavity) structure.

2. Description of the Related Art

In recent years, flat panel displays (FPD) having a thin thickness and which allow reduction in size have attracted much attention. Of various FPDs, liquid crystal display devices are used in various devices. Currently, there is intense research and development into light emitting devices (display devices and light sources) in which a self-emitting electroluminescence (hereinafter referred to simply as "EL") elements, in particular, organic EL display devices which can emit light at various light emission colors and at a high brightness depending on organic compound materials to be used.

Because an organic EL display device differs from a liquid crystal display device which employs a system in which transmissivity of light from a backlight is controlled by a liquid crystal panel which is placed as a light valve in front of the backlight and the organic EL display device is self-emissive as described above, fundamentally, the usage efficiency of light, that is, the extraction efficiency of light to the outside is high, and consequently, light emission of high brightness can be achieved by the organic EL display device.

However, the light emission brightness of currently proposed organic EL elements is not sufficient. In addition, there is a problem in that, when the supplied current to the organic layer is increased in order to improve the light emission brightness, deterioration of the organic layer is accelerated.

As a method for solving these problems, a method can be considered in which intensity of light at a certain wavelength is intensified in an EL display device by employing a microresonator, as described in Japanese Patent Laid-Open Publication No. Hei 6-275381 and in Takahiro Nakayama and Atsushi Tsunoda, "Elements having Optical Cavity Structure", Molecular Electronics and Bioelectronics Division of Japan Society of Applied Physics, Third Convention of 1993, p. 135–p.143.

When a microcavity (microresonator) structure is to be employed in an organic EL element, a metal electrode (for example, cathode) which functions as a reflective mirror is provided as an electrode which is on a rear side of the element, a semi-transmissive mirror is provided on a front surface (on the side of the substrate) of the element, and the optical length L between the semi-transmissive mirror and the metal electrode is designed such that the following equation (1) is satisfied.

$$2nL=(m+\tfrac{1}{2})\lambda \quad (1)$$

wherein λ is the light emission wavelength. With this structure, it is possible to selectively intensify light at the wavelength λ and to emit the light to the outside. The variable n in equation (1) represents an index of refraction and the variable m represents an integer (0, 1, 2, 3, . . . ).

This relationship can be easily designed when an organic EL display device having a single wavelength as the emission wavelength, that is, a monochrome organic EL display device, is used, or when the display device is used as a surface light source.

However, when a full-color organic EL display device is to be manufactured, the wavelengths to be intensified within one display panel include, for example, 3 colors of R, G, and B. Therefore, light at different wavelengths must be intensified in different pixels. In order to do so, the optical lengths L between the semi-transmissive mirror and the metal electrode must be changed for each pixel depending on the wavelength of light to be emitted.

On the other hand, unlike a semiconductor device used in an integrated circuit or the like, in a display device, the display itself is viewed by a viewer. Therefore, no structure can be actually employed as a display device unless the structure can stably achieve a high display quality in all pixels.

Because of this, although, for example, theoretically, the cavity (resonator) structure as described above can be realized in a full color display device by setting the optical length in each pixel depending on the light emission wavelength, when the pixels are independently manufactured to achieve different thicknesses, the number of processes in the manufacturing is inevitably increased and the manufacturing processes become more complicated, which results in serious degradation of the quality and variation. In particular, because an organic EL display device currently has a problem with respect to the stability of the display quality, if a resonator structure is simply used, the yield is reduced when the display devices are mass-produced and the manufacturing cost is significantly increased. Therefore, application of the microresonator to an EL display device has been only researched and has not yet been commercialized.

SUMMARY OF THE INVENTION

The present invention was conceived to realize a display device having a microresonator. According to one aspect of the present invention, there is provided a display device comprising a plurality of pixels and which realizes a color display using emitted light of at least two wavelengths, wherein each of the plurality of pixels comprises a microresonator structure formed between a lower reflective film formed on a side near a substrate and an upper reflective film formed above the lower reflective film with an organic light emitting element layer therebetween, the organic light emitting element layer having at least one layer, a conductive resonator spacer layer having an individual pattern for each pixel is provided between the lower reflective film and the organic light emitting element layer, at least the conductive resonator spacer layer provided in apart of the plurality of pixels comprises a plurality of transparent conductive metal oxide layers and a light transmissive layer provided between the transparent conductive metal oxide layers and having an index of refraction with a difference within ±25% from an index of refraction of the transparent conductive metal oxide layer, and light obtained in the organic light emitting element layer is intensified by the microresonator structure formed between the lower reflective film and the upper reflective film and is emitted to the outside.

According to another aspect of the present invention, there is provided a display device comprising a plurality of pixels and which realizes a color display using emitted light of at least two wavelengths, wherein each of the plurality of pixels comprises a microresonator structure formed between a lower reflective film formed on a side near a substrate and an upper reflective film formed above the lower reflective film with an organic light emitting element layer therebetween, the organic light emitting element layer having at least one layer, a conductive resonator spacer layer having an individual pattern for each pixel is provided between the lower reflective film and the organic light emitting element layer, the conductive resonator spacer layer provided in a part of the plurality of pixels comprises a single layer or a plurality of transparent conductive metal oxide layers, the conductive resonator spacer layer provided in pixels other than the part of the plurality of pixels and having a light emission wavelength different from the part of the plurality of pixels comprises a plurality of transparent conductive metal oxide layers and a light transmissive layer provided between the transparent conductive metal oxide layers and having an index of refraction with a difference within ±25% from an index of refraction of the transparent conductive metal oxide layers and light obtained in the organic light emitting element layer is intensified by the microresonator structure formed between the lower reflective film and the upper reflective film and is emitted to the outside.

According to another aspect of the present invention, it is preferable that, in the display device, the transparent conductive metal oxide used in the conductive resonator spacer layer is a material which satisfies a condition that an etching rate of the transparent conductive metal oxide in a polycrystalline state with respect to an etching agent for the transparent conductive metal oxide in an amorphous state is less than $\frac{1}{10}$ of an etching rate of the amorphous transparent conductive metal oxide with respect to the etching agent for the amorphous transparent conductive metal oxide, and a condition that an etching rate of the polycrystalline transparent conductive metal oxide with respect to an etching agent for a material of the light transmissive layer is less than $\frac{1}{10}$ of an etching rate of the light transmissive layer with respect to the etching agent for the material of the light transmissive layer.

According to another aspect of the present invention, it is preferable that, in the display device, the transparent conductive metal oxide layer of the conductive resonator spacer layer is formed by an indium tin oxide, and the light transmissive layer is formed by a silicon nitride.

According to another aspect of the present invention, it is preferable that, in the display device, the lower reflective film contains silver, gold, platinum, aluminum, or an alloy of any of these metals.

According to another aspect of the present invention, there is provided a method for manufacturing a display device comprising a plurality of pixels and in which each pixel comprises a microresonator formed between a lower reflective film and an upper reflective film formed above the lower reflective film with an organic light emitting element layer therebetween, the organic light emitting element layer having at least one layer, an optical length corresponding to a distance between the lower reflective film and the upper reflective film of the microresonator differing among pixels corresponding to light emission wavelengths, and a color display being realized by emitted light of at least two wavelengths, wherein a conductive resonator spacer layer for adjusting the optical length which contains a transparent conductive metal oxide is formed for each pixel after the lower reflective film is formed and before the organic light emitting element layer is formed, and wherein, during formation of the conductive resonator spacer layer, an amorphous spacer layer made of an amorphous transparent conductive metal oxide and having a predetermined thickness is formed in each pixel region after the lower reflective film is formed, the amorphous spacer layer is polycrystallized through annealing to form a polycrystalline spacer layer, a silicon nitride film is formed at least in some pixel regions after the polycrystalline spacer layer is formed, an amorphous spacer layer made of an amorphous transparent conductive metal oxide and having a predetermined thickness is formed after the silicon nitride layer is formed, and the amorphous spacer layer is etched and removed in a part of pixel regions of the plurality of pixels using the polycrystalline spacer layer as an etching stopper so that a total final thickness of the conductive resonator spacer layer differs at least between a pixel region in which the amorphous spacer layer is removed and a pixel region having the polycrystalline spacer layer and the silicon nitride layer and in which the amorphous spacer layer remains above the silicon nitride layer.

According to another aspect of the present invention, it is preferable that, in the method for manufacturing a display device, each of the amorphous spacer layers is patterned into a shape for each pixel through photolithography after the amorphous spacer layer is layered.

According to another aspect of the present invention, it is preferable that, in the method for manufacturing a display device, the transparent conductive metal oxide is an indium tin oxide.

According to another aspect of the present invention, it is preferable that, in the method for manufacturing a display device, during formation of the conductive resonator spacer layer, an etching rate of the amorphous spacer layer with respect to an etching agent for the amorphous spacer layer and an etching rate of the silicon nitride layer with respect to an etching agent for the silicon nitride layer are 10 times or greater of etching rates of the polycrystalline spacer layer with respect to the etching agents.

According to another aspect of the present invention, it is preferable that, in the method for manufacturing a display device, the etching process of the amorphous spacer layer using the polycrystalline spacer layer as an etching stopper is a wet etching process using an aqueous solution containing hydrochloric acid and nitric acid.

According to another aspect of the present invention, it is preferable that, in the method for manufacturing a display device, the etching process of the silicon nitride layer using the polycrystalline spacer layer as an etching stopper is a wet etching process using an aqueous solution containing hydrofluoric acid, nitric acid, and acetic acid.

According to another aspect of the present invention, it is preferable that, in the method for manufacturing a display device, an amorphous conductive metal oxide layer is formed as a first spacer layer on the lower reflective film without exposure to the atmosphere after the lower reflective film is formed.

According to another aspect of the present invention, it is preferable that, in the method for manufacturing a display device, the lower reflective film contains silver, gold, platinum, aluminum, or an alloy of any of these metals.

According to another aspect of the present invention, it is preferable that, in the method for manufacturing a display device, the conductive resonator spacer layer is an electrode which is provided between the lower reflective film and the organic light emitting element layer and which supplies charges to the organic light emitting element layer.

According to the present invention, it is possible to easily and accurately form a microresonator corresponding to each light emission wavelength in each pixel of a display device. In particular, it is possible to form the conductive resonator spacer layer with a high positional precision through photolithography. In addition, it is possible to easily change a total thickness of the conductive resonator spacer layer corresponding to the light emission wavelength (intensification wavelength) by changing a number of layers or a number of remaining layers of a plurality of, for example, conductive metal oxide layers and light transmissive layer.

Regarding the number of layers or the number of remaining layers of conductive metal oxide layers, it is possible to take advantage of a difference or differences in etching rates between an amorphous conductive metal oxide and a polycrystalline conductive metal oxide or between a silicon nitride and the polycrystalline conductive metal oxide to selectively remove the amorphous conductive metal oxide layer or the silicon nitride layer formed at an upper layer using the polycrystalline conductive metal oxide layer formed at a lower layer as an etching stopper, to thereby easily change the number of layers or number of remaining layers with a high precision in thickness.

BRIEF DESCRIPTION OF THE DRAWINGS

A Preferred embodiment of the present invention will be described in detail based on the following drawings, wherein:

FIGS. 4A, 4B, 4C, 4D, 4E and 4F are diagrams showing a manufacturing process of a conductive resonator spacer layer according to a preferred embodiment of the present invention;

FIGS. 6A, 6B, 6C, 6D, 6E and 6F are diagrams showing another manufacturing process of a conductive resonator spacer layer according to a preferred embodiment of the present invention;

FIGS. 8A, 8B, 8C, 8D and 8E are diagrams showing a manufacturing process of a conductive resonator spacer layer using ITO and SiNx according to a preferred embodiment of the present invention.

DESCRIPTION OF PREFERRED EMBODIMENT

Figure 1:
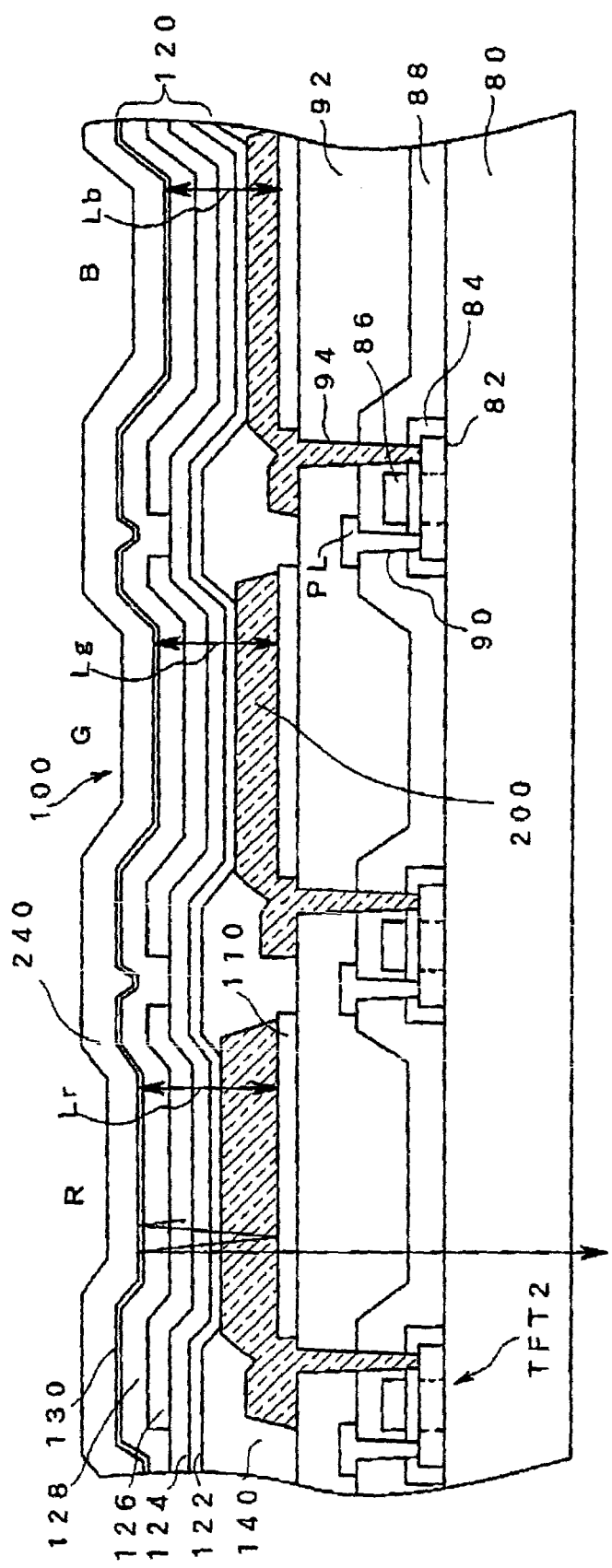
FIG. 1 is a diagram schematically showing a cross sectional structure of a display device having a microresonator structure according to a preferred embodiment of the present invention.

A preferred embodiment (hereinafter, referred to simply as "embodiment") of the present invention will now be described referring to the drawings.

FIG. 1 is a diagram schematically showing a cross sectional structure of a display device having a microresonator (microcavity) structure according to a preferred embodiment of the present invention. The display device is a light emitting display device having a self-emissive display element in each pixel. The present invention will be described exemplifying an organic EL display device in which an organic EL element is used as the display element.

An organic EL element 110 has a layered structure having an organic light emitting element layer 120 which at least includes an organic compound, in particular, an organic light emitting material, between a first electrode 200 and a second electrode 240. The organic EL element 100 takes advantage of a principle that electrons are injected from an anode to the organic layer and holes are injected from a cathode to the organic layer, the injected electrons and holes recombine within the organic layer, the organic light emitting material is excited by the obtained recombination energy, and light is emitted when the organic light emitting material returns to its ground state.

A conductive metal oxide material such as, for example, ITO (Indium Tin Oxide) is used as the first electrode 200 and Al or an alloy of Al which functions as an upper reflective film is used as the second electrode 240. A lower reflective film 110 is provided below the first electrode 200 for forming a microresonator structure between the upper reflective film and the lower reflective film.

When a bottom emission type display device is to be realized in which light obtained in the organic light emitting element layer 120 is emitted to the outside through the transparent first electrode 200 and the substrate 80, the lower reflective film 110 must be formed in a semi-transmissive manner which can partially allow light from the light emitting element layer 120 to transmit. As the lower reflective film 110, it is possible to employ any of Ag, Au, Pt, and Al or an alloy film thereof. The lower reflective film 110 is formed to a thickness which allows light to transmit or in a pattern having an opening such as a mesh shape and a lattice shape.

The organic light emitting element layer 120 has a light emitting layer which at least contains an organic light emitting molecule and may be formed in a single-layer structure or a layered structure of a plurality of layers such as 2, 3, and 4 layers, depending on the material. In the configuration of FIG. 1, the organic light emitting element layer 120 has a structure in which a hole injection layer 122, a hole transport layer 124, a light emitting layer 126, an electron transport layer 128, and an electron injection layer 130 are layered in this order from the side near the first electrode 200 which functions as the anode through continuous film formation of vacuum evaporation or the like. Moreover, the second electrode 240 which functions as the cathode in this configuration is formed on the electron injection layer 130 continuous from the organic light emitting element layer 120 through vacuum evaporation similar to the organic light emitting element layer 120.

The emitted light of the organic EL element depends on the organic light emitting molecule. In the case of a color display device having colors of R, G, and B, it is possible to form the light emitting layers 126 in individual patterns for each pixel and use different light emitting materials for R, G, and B. In this case, the light emitting layers 126 are set in patterns separate for R, G, and B pixels in order to at least prevent mixture or colors, and are formed in separate steps for R, G, and B. In the present embodiment, a light emitting material common to all pixels is used as the light emitting layer 126 and the same white light emitting layer is employed in all pixels, although the structure of the present embodiment is not limited to this configuration. More specifically, a layered structure of light emitting layers of orange and blue which are complementary colors is employed as the light emitting layer 126 and light emission of white color is realized by addition of colors.

When a white color light emitting EL element is employed in all pixels, all layers in the organic light emitting element layer 120 can be formed common to all pixels. However, in order to more reliably control light emission for each pixel to increase the contrast, it is also possible to employ an individual pattern for each pixel. By forming the film using a mask (for example, through vacuum evaporation), the white color light emitting layer 126 can be formed in an individual pattern for each pixel simultaneous with the formation of the light emitting layer 126. In the configuration of FIG. 1, the same white color light emitting layer 126 is formed in an individual pattern for each pixel. The other layers, that is, the hole injection layer. 122, the hole transport layer 124, the electron transport layer 128, and the electron injection layer 130, are formed common to all pixels (these layers may also be formed in an individual pattern in desired sizes using a mask) and the second electrode 240 is also formed common to all pixels.

The organic light emitting element layer 120 has a function to transport holes or electrons, but has a high resistance. Thus, charges are injected to the organic light emitting element layer 120 only in a region in which the first electrode 200 and the second electrode 240 directly oppose each other with the organic light emitting element layer 120 therebetween and the light emitting region of the organic EL element 100 corresponds to this region in which the first electrode 200 and the second electrode 240 oppose each other. More specifically, because end regions of the first electrode 200 are covered by a planarizing insulating layer 140, an opening region in the planarizing insulating layer 140 above the first electrode 200 becomes the light emitting region of the organic EL element 100.

The microresonator (microcavity) structure of the present embodiment is formed in the region in which the transparent first electrode 200 and the second electrode 240 oppose each other with the organic light emitting element layer 120 therebetween, between the lower reflective film 100 below the first electrode 200 and the second electrode 240 which also functions as the upper reflective film. An optical length L of the microresonator is actually a length corresponding to an interlayer distance (thickness) between the lower reflective film 110 and the upper reflective film 240 and a penetration distance of light in the lower reflective film 110 and the upper reflective film 240. Optical lengths L (Lr, Lg, and Lb) described by the above-described equation (1) are formed in the pixels of R, G, and B corresponding to the wavelengths λ of R, G, and B (λr, λg, and λb). Here, because a metal material is used for the lower reflective film 110 and the upper reflective film 240, the penetration distance of light in these films is approximately zero. Because of this, with the white light emitted from the white light emitting layers 125 having the same structure, for example, only the light of wavelength of R, G, or B is resonated and intensified corresponding to the optical lengths L in each pixel and is emitted to the outside. In a configuration in which the emission colors of the light emitting layers 126 are R, G, and B corresponding to the R, G, and B pixels, the light of the wavelength λ corresponding to the optical length L of the microresonator formed in the pixels is intensified among the wavelength components and is emitted to the outside. In addition, because the directionality of the emitted light, in particular, the directionality toward the front direction of view of the display, is improved with the microresonator structure, the light emission brightness at the front position can be increased.

In the present embodiment, in order to vary the optical lengths L among the pixels based on the light emission wavelength λ, of the first electrode 200 present between the lower reflective film 110 and the upper reflective film 240 and the organic light emitting element layer 120, a conductive resonator (cavity) space layer is used as the first electrode 200 to adjust the thickness.

In the present embodiment, when a conductive resonator spacer layer 200 having an individual pattern for each pixel and having a thickness different for each light emission wavelength (for example, R, G, and B) is formed, the conductive resonator spacer layer 200 is patterned through photolithography hating a high pattern precision. The thickness required as the conductive resonator spacer layer 200 is changed corresponding to pixels of different light emission wavelengths by layering a plurality of ITO spacer layers having a predetermined thickness and changing a number of layers or a number of remaining layers, instead of forming the conductive resonator spacer layers 200 having thicknesses different from each other in separate steps. The number of remaining layers of the plurality of layered ITO spacer layers can be controlled by whether or not the ITO spacer layer layered on the ITO spacer layers which are already formed is selectively removed.

In order to selectively remove only the ITO spacer layer at an upper layer from a layered structure of two ITO spacer layers, in the present embodiment, a difference between etching rates (etching speeds) of an amorphous ITO (a-ITO) and a polycrystalline ITO (p-ITO) with respect to an etching agent (etchant) is utilized. For example, the etching speed of a-ITO with respect to an etchant used in a wet etching of ITO (for example, a mixture solution of HCl, $HNO_3$, and $H_2O$, that is, an aqueous solution of HCl and $HNO_3$) is 10 times or greater that of the etching speed of p-ITO, more accurately, is greater by a factor of several tens. When such an etching agent is used, a selection ratio which is a ratio between etching speeds of the a-ITO layer at the upper layer with respect to the p-ITO layer at the lower layer becomes very large.

Therefore, by forming a layered structure of p-ITO layer/a-ITO layer from the bottom for every pixel, masking the a-ITO layer at a predetermined pixel region, and etching using an etching agent having a selection ratio as described above, it is possible to etch and remove the a-ITO layer only in the pixel region which is not masked and to automatically stop the etching process when the upper surface of the p-ITO layer is exposed. In this manner, because the p-ITO layer can be used as an etching stopper, it is possible to accurately form a conductive resonator spacer layer 200 having different total thicknesses between a region in which the a-ITO layer above the p-ITO layer is not removed and a region in which the a-ITO layer is removed, the thicknesses differing by an amount corresponding to the thickness of the a-ITO layer. The a-ITO layer which remains without being etched is polycrystallized into a p-ITO layer through an annealing process which is applied before formation of the organic light emitting element layer 120 is started so that all of the ITO layers forming the first electrode 200 of the organic EL element 100 are ultimately polycrystallized.

Figure 7:
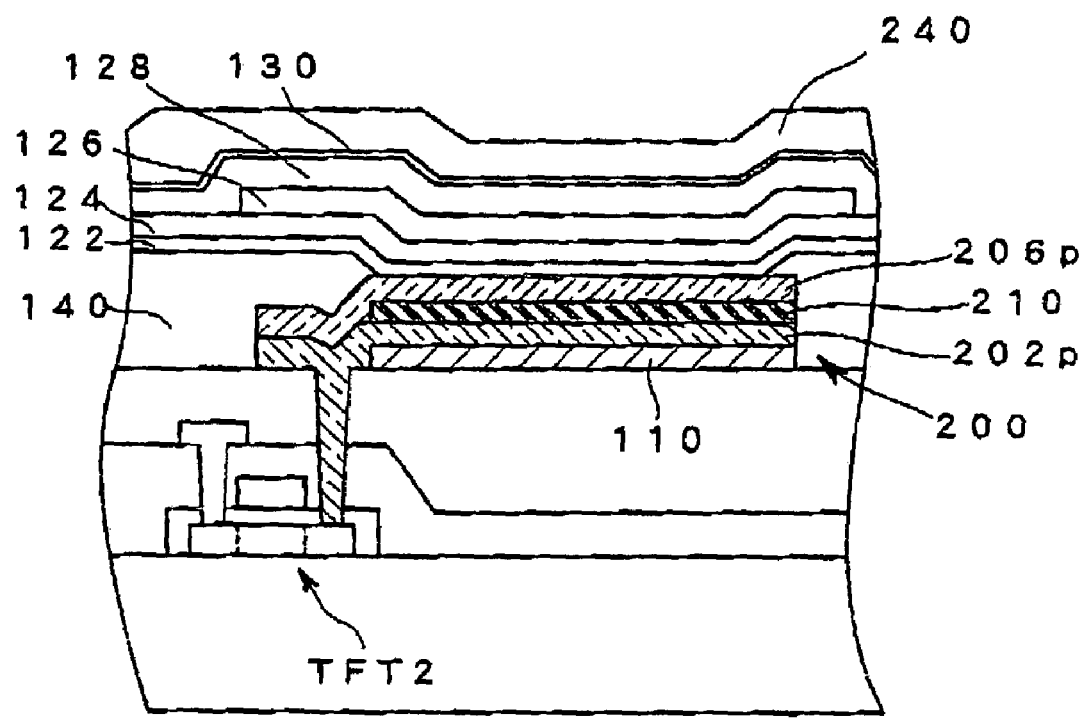
FIG. 7 is a diagram showing a structure of a conductive resonator spacer layer having a layered structure of ITO and SiNx according to a preferred embodiment of the present invention.

In addition, it is also possible to use the p-ITO layer as an etching stopper not only for the a-ITO layer, but also with respect to an etching agent (for example, a mixture solution of HF, $HNO_3$, CHCHOOH, and $H_2O$, that is, an aqueous solution of hydrofluoric acid, nitric acid, and acetic acid) for, for example, a silicon nitride (SiNx). Thus, it is possible to employ, as the conductive resonator spacer layer 200, a layered structure of ITO layers 202p and 206p and a SiNx layer 210 as shown in FIG. 7, in place of the layered structure of the ITO layers so that the thickness of the conductive resonator spacer layer 200 varies among pixels of different light emission wavelengths.

The conductive resonator spacer layer 200 is located between the lower reflective film 110 and the upper reflective film 240 and light from the organic light emitting element layer 120 must transmit through the conductive resonator spacer layer 200. Therefore, it is necessary that the layers forming the conductive resonator spacer layer 200 along with the ITO at least be light transmissive. In addition, when the conductive resonator spacer layer 200 is formed in a layered structure of an ITO layer and a layer which uses a material other than ITO, it is desirable that the indices of refraction for the layers be as close as possible. When the index of refraction significantly differs between adjacent layers, reflection and diffusion of light occur at the interface and loss of light is generated in the light obtained in the organic light emitting element layer 120. It is necessary that at least a difference between the index of refraction of the light transmissive layer and the index of refraction of the ITO layer is within ±25%, and it is desirable that the difference is within ±20%. The index of refraction of ITO is approximately 1.9 and the index of refraction of the SiNx layer is also approximately 1.9. Therefore, reflection of light does not occur at the interface between the SiNx layer and the ITO layer, and thus, it is possible to form the conductive resonator spacer layer 200 by layering these layers.

The ITO layers forming the conductive resonator spacer layer 200 can be formed, for example, through sputtering. Alternatively, it is also possible to form the ITO layers through vacuum evaporation. The SiNx layer 210 shown in FIG. 7 can be formed, for example, through sputtering or plasma CVD.

In the present embodiment, it is desirable to employ a metal thin film having a high reflectivity such as, for example, Ag for the lower reflective film 110 formed below the conductive resonator spacer layer (first electrode) 200 and the process moves to the formation process of the first electrode 200 without exposure to the atmosphere (air) after the lower reflective film 110 is formed. With this structure, it is possible to reliably prevent reduction in the reflectivity and reduction in degree of contact of the first electrode 200 to the lower reflective film 110 due to coverage of the surface of the lower reflective film 110 by a natural oxide film or adhesion of impurities on the interface between the lower reflective film 110 and the first electrode 200.

The microresonator according to the present embodiment is not limited to the bottom emission type structure as described above and may also be applied to a top emission type EL display device.

Figure 2:
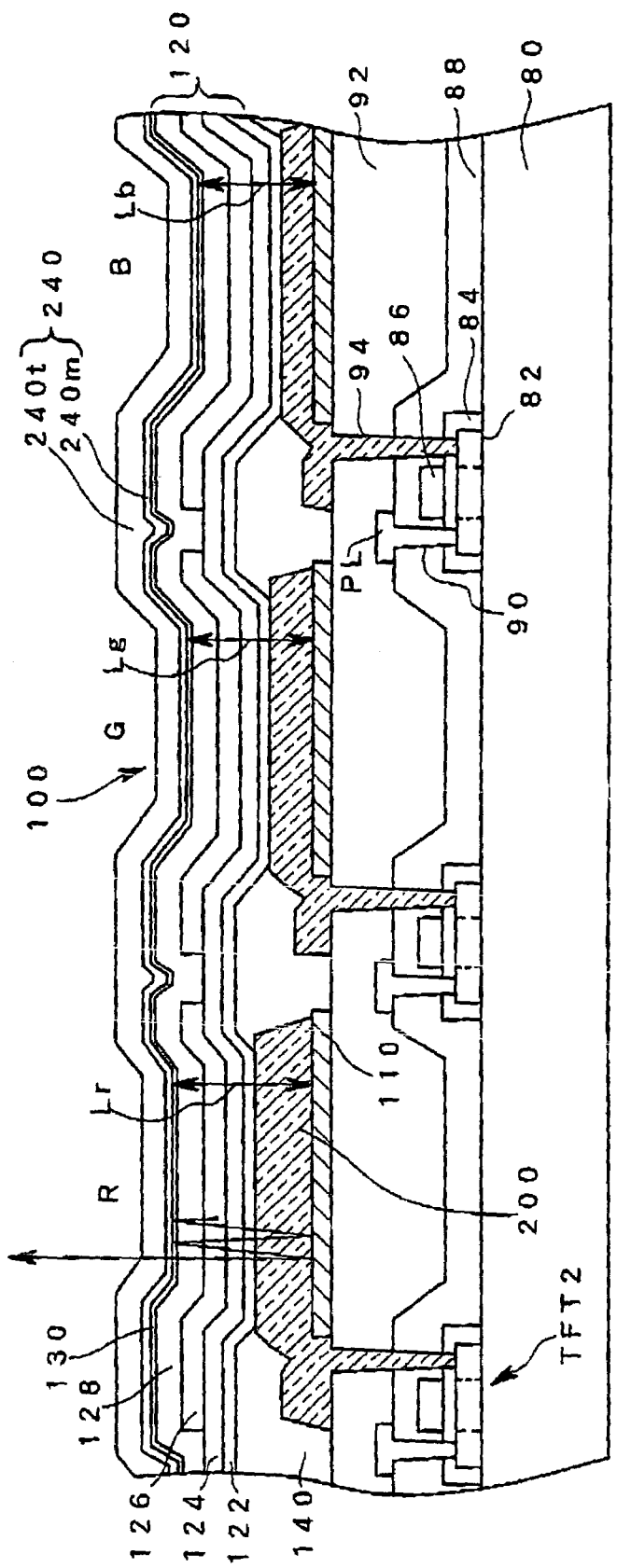
FIG. 2 is a diagram schematically showing another cross sectional structure of a display device having a microresonator structure according to a preferred embodiment of the present invention.

FIG. 2 shows a structure in which a microresonator structure is employed in a top emission type display device in which light obtained in the organic light emitting element layer 120 is emitted through the second electrode 240. In a top emission type structure, a light reflection film (mirror) having a reflectivity of approximately 100% is used as the lower reflective film 110. In this structure also, the lower reflective film 110 is formed to a sufficient thickness using the same material as that of the semi-transmissive lower reflective film 110 as described above, or as a film without any opening.

The second electrode 240 must be optically transmissive. When the second electrode 240 functions as a cathode, a metal thin film 240m made of a material of a low work function such as Ag and Au for maintaining electron injecting characteristics is provided on a side near the interface with the organic light emitting element layer 120 to a thin thickness which allows light to transmit, or in a pattern having an opening such as a mesh shape or a lattice shape and a transparent conductive layer 240t made of ITO or the like is formed on the thin film 240m to form the second electrode 240. The upper reflective film for forming the microresonator with the lower reflective film 110 may be realized using the semi-transmissive metal thin film 240, formed on the side of the second electrode 240 near the interface with the organic light emitting element layer 120.

In the present embodiment, in either a bottom emission type display device or a top emission type display device, a microresonator structure is formed between the lower reflective film 110 and the upper reflective film 240 as described above. In addition, in both cases, the p-ITO layer is used as an etching stopper to realize different thicknesses of the first electrode 200 for different light emission wavelengths by employing a single layer or a multiple layer structure (including a multiple layer structure with SiN) of the ITO layer or ITO layers and the first electrode 200 is used as the conductive resonator spacer layer for adjusting the optical distance L.

In the present embodiment, an active matrix organic EL display device can be employed in which a switching element is provided in each pixel and the organic EL element is individually controlled. The first electrode 200 is electrically connected to a corresponding switching element and is formed in an independent pattern for each pixel. With the first electrode 200 having an individual pattern for each pixel, even when the first electrode 200 is formed to thicknesses different for pixels of R, G, and B, it is possible to reliably and easily adjust the optical length L of the pixel without affecting the structure of pixels of other colors. In a passive matrix display device in which no switching element is provided in each pixel, a method for changing the thicknesses, of a plurality of the first electrodes 200 which are formed along one direction in a stripe pattern, line by line may be employed, as such a method allows ease and high reliability for the manufacturing steps and the structure of the device.

In order to change the optical length L, it is also possible to change other conditions such as, for example, the thickness of the organic light emitting element layer 120 for the pixels of different light emission wavelengths. However, the layers formed common to all pixels among the layers in the organic light emitting element layer 120 are preferably simultaneously formed because such a configuration simplifies the manufacturing steps, and, moreover, it is very important to continuously form the films in the organic light emitting element layer 120 having a layered structure with a minimum number of steps and without breaking the state of vacuum in order to prevent deterioration as the organic layer of the organic EL element is known to deteriorate due to moisture, oxygen, and particles.

Figure 3:
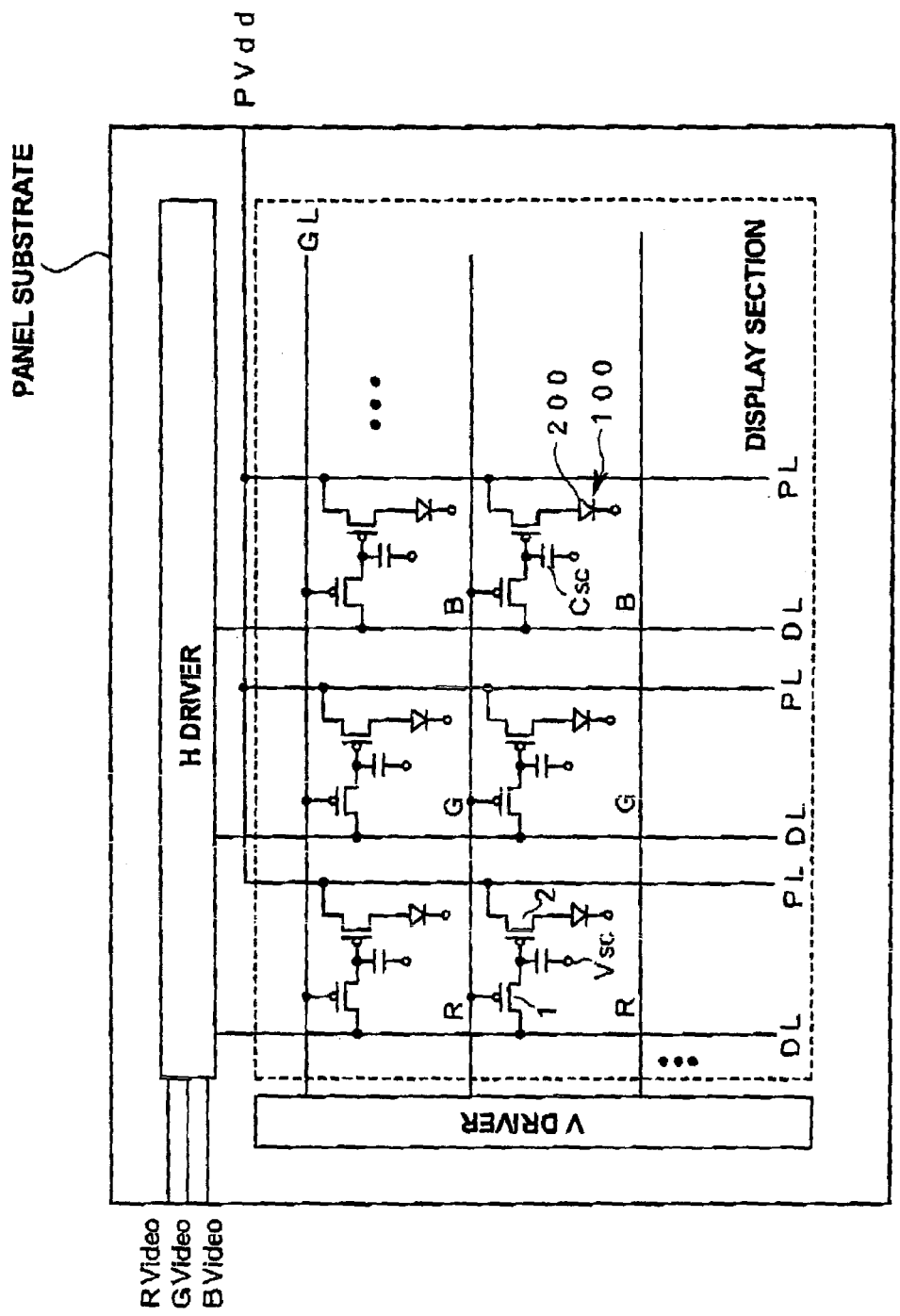
FIG. 3 is a diagram schematically showing a circuit of an active matrix organic EL display device according to a preferred embodiment of the present invention.

FIG. 3 is a diagram schematically showing a circuit structure of an active matrix organic EL display device according to the present embodiment. The circuit structure is not limited to that shown in FIG. 3, but, as an example configuration, each pixel comprises an organic EL element 100, a switching TFT 1, an EL driver TFT 2, and a storage capacitor Csc. A gate electrode of the TFT 1 is electrically connected to a gate line GL which extends along a horizontal direction of the display device and to which a scan signal is supplied. A source (or drain) of the TFT 1 is connected to a data line DL which extends along a vertical direction and to which a data signal is supplied. The storage capacitor Csc is connected to a drain (or source) of the switching TFT 1. When a scan signal is output and the TFT 1 is switched on, a voltage corresponding to a data signal voltage on the data line DL supplied via the source and drain of the TFT 1 is stored in the storage capacitor Csc until the next time the pixel is selected. The voltage stored in the storage capacitor Csc is applied to a gate electrode of the EL driver TFT 2 and the TFT 2 supplies a current from a power supply (PVdd) line PL to the first electrode 200 (in this configuration, anode) of the organic EL element 100 based on the voltage applied to the gate electrode of the TFT 2.

The TFT connected to the first electrode 200 of the organic EL element 100 in FIGS. 1 and 2 corresponds to the EL driver TFT 2 of FIG. 3 and the switching TFT 1 and the storage capacitor Csc are not shown in FIGS. 1 and 2. Both TFTs 1 and 2 use, as an active layer 82 formed on a glass substrate 80, polycrystalline silicon films which are simultaneously formed by polycrystallizing amorphous silicon through laser annealing. In addition, the elements necessary for the TFTs such as gate insulating films 84 and gate electrodes 86 are formed almost simultaneously and through the same processes. The semiconductor film 82 of the TFT 1 also functions as one of the electrodes of the storage capacitor Csc and the other electrode of the storage capacitor Csc is formed by a capacitor electrode line which opposes the first electrode of the storage capacitor Csc with the gate insulating film 84 therebetween, made of the same metal material as the gate electrode 86, and to which a predetermined capacitor voltage Vsc is applied.

The storage capacitor Csc, TFT 1, and TFT 2 are covered by an interlayer insulating film 88. A data line DL is connected to the source (or drain) of the TFT 1 through a contact hole 90 formed through the interlayer insulating film 88 and a power supply line PL is connected to the source (or drain) of the TFT 2 through a contact hole 90 formed through the interlayer insulating film 88. Furthermore, a planarizing insulating layer 92 made of a resin or the like is formed covering the interlayer insulating film 88, the data line DL, and the power supply line PL. The first electrode 200 is connected to the drain (or source) of the TFT 2 through a contact hole 94 formed through the planarizing insulating layer 92 and the interlayer insulating film 88.

As shown in FIGS. 1 and 2, the first electrode 200 also functions as the resonator spacer layer and is transparent and the lower reflective film 110 is formed below the first electrode 200, that is, the lower reflective film 110 is formed on the planarizing insulating layer 92 before the first electrode 200 is formed. In order to further improve reliability of connection between the TFT and the first electrode 200 at the contact hole 94, it is preferable that the lower reflective film 110 is not formed in the contact hole 94 as shown in FIGS. 1 and 2. It is possible to realize this configuration by using a mask having a pattern in which a region of the contact hole 94 is blocked, during the formation of the lower reflective film 110. However, as long as the contact can be reliably achieved, it is also possible to form the lower reflective film 110 also in the contact hole 94 and to form the first electrode 200 on the lower reflective film 110.

As shown in FIGS. 1 and 2, the surface of the first electrode 200 in the formation region of the contact hole 94 may be lower than the surface of the first electrode 200 in other regions. As described, in the present embodiment, it is important that the optical length L in the resonator is accurately set in order to determine the light emission wavelength (resonator wavelength) $\lambda$. Therefore, it is preferable to cover the region in which the surface is not flat, that is, the region above the contact hole 94 which tends to generate variation in the optical length L within a pixel, with the planarizing insulating layer 140 which covers around the ends of the first electrode 200.

Next, an example of a method for manufacturing a conductive resonator spacer layer 200 having a thickness which differs for different light emission wavelengths will now be described referring to FIGS. 4A–4F and 5A–5D. On a substrate, a TFT, an interlayer insulating film (88) covering the TFT, and a planarizing insulating film (92) are already formed as shown in FIGS. 1 and 2. In the exemplified structure, an Ag film is formed on the planarizing insulating film as the lower reflective film 110 through vacuum evaporation. The lower reflective film 110 may alternatively be formed through sputtering. By using a mask having openings in the pixel regions during the film formation, it is possible to pattern the film simultaneously with the formation of the film. It is also possible to pattern the Ag film into a shape for each pixel through photolithography after the Ag film is formed over the entire surface of the substrate. As the lower reflective film 110, in addition to the Ag layer as described, it is also possible to use any of Au, Pt, Al, and an alloy film of any of these metals. When light is to be emitted to the outside through the lower side (substrate side) of FIGS. 4A–4F, the lower reflective film 110 is formed in a thin thickness that allows light to transmit by controlling the film formation time, formed using a mask during film formation, or patterned to have a plurality of openings in one pixel region such as a mesh shape and lattice shape at the same time as the patterning into the shape of each pixel.

After the lower reflective film 110 is formed in a pattern for each pixel as shown in FIG. 4A, an ITO layer 202*a* in an amorphous state (a-ITO) is continuously formed through sputtering over the entire surface of the substrate covering the lower reflective film 110 so that the surface of the lower reflective 110 is not exposed to the atmosphere.

Then, a resist layer is formed on the a-ITO layer 202*a* and is exposed so that a resist mask layer having a pattern covering the a-ITO layer 202*a* in each pixel region is formed as shown in, for example, FIG. 4B and an etching mask 204*m*1 is obtained through photolithography.

Then, using, as an etchant, for example, an aqueous solution of HCl and HNO$_3$ as described above, the region of the a-ITO layer 202*a* not covered by the etching mask 204*m*1 is etched and removed. The etching mask 204*m*1 is then removed so that the a-ITO layer 202*a* remains in a pattern for each pixel on the lower reflective film 110 as shown in FIG. 4c. The etching mask 204*m*1 is removed using an etchant for removing a mask after the a-ITO layer 202*a* is etched.

After the a-ITO layer 202*a* is patterned, a polycrystallization annealing process for polycrystallizing the ITO layer is applied. In order to transform amorphous ITO into polycrystalline ITO, it is necessary to anneal the amorphous layer at a temperature of 150° C. or higher. Therefore, it is desirable that the annealing temperature (environmental temperature; in reality, because the annealing is executed for a relatively long period, the film temperature is almost identical) be set to 200° C. or higher, and, more preferably, to 220° C. or higher. The annealing period (net annealing period excluding the temperature rising period and the temperature lowering period) is not limited as long as the period is sufficient for polycyrstallizing the amorphous ITO, and may be set to, for example, about 10 minutes–about 6 hours, and to two hours as an example. The polycrystallization annealing process is executed in a dry nitrogen atmosphere from the viewpoint of preventing surface transformation of the ITO layer or the like and is executed by placing the substrate to be processed in a chamber which is set to an environmental temperature of approximately 220° C. as described above or by applying a lamp annealing process. Through the polycrystallization annealing process, the a-ITO layer 202a is polycrystallized and a p-ITO layer 202p as shown in FIG. 4D is obtained.

After the p-ITO layer 202p is obtained, as shown in FIG. 4E, an a-ITO layer 206a having a predetermined thickness is formed over the entire surface of the substrate covering the p-ITO layer 202p through sputtering or the like. Then, an etching mask 204m2 is formed through photolithography to cover only a region above a pixel region (in the illustrated configuration, G pixel region and R pixel region) where a conductive resonator spacer layer having a thickness exceeding the thickness of the first p-ITO layer 202p is to be formed.

Using the etching mask 204m2 as a mask, the a-ITO layer 206a is etched using an etchant which can remove the a-ITO layer 206a at a rate which is greater than a rate for removing the p-ITO layer 202p by a factor of several tens, for example, the aqueous solution of HCl and HNO$_3$ as described above. By executing the etching process using such an etchant, the a-ITO layer 206a which is not covered by the etching mask 204m2 as described above is removed at a high selection ratio and the p-ITO layer 202p formed below the a-ITO layer 206a is removed only by a small degree by this etchant. Therefore, the etching of the a-ITO layer 206a automatically stops when the upper surface of the p-ITO layer 202p is exposed in the pixel region where the p-ITO layer 202p is present in the lower layer (in the exemplified configuration, B pixel region). In this manner, the a-ITO layer 206a is selectively etched from above the p-ITO layer 202p. After the a-ITO layer 206a is etched, the etching mask 204m2 is removed so that only the pixel region in which the etching mask 204m2 was present (in the exemplified configuration, the G and R pixel regions) has a layered structure of the a-ITO layer 206a formed above the p-ITO layer 202p as shown in FIG. 4F, and a single layer structure of the first p-ITO layer 202p is obtained in the pixel region which is not covered by the mask 204m2 (B region).

Figure 5A:
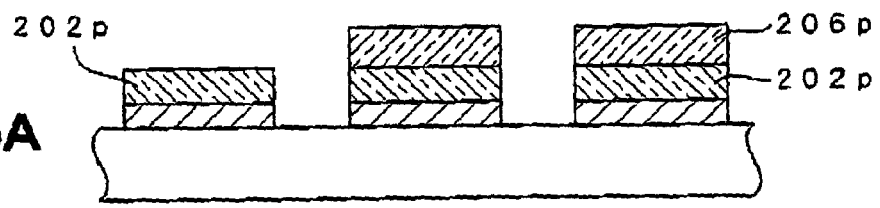
FIGS. 5A, 5B, 5C and 5D are diagrams showing manufacturing steps of a conductive resonator spacer layer continuing from the steps in FIG. 4F according to a preferred embodiment of the present invention.

Then, an annealing process for polycrystallizing the a-ITO layer 206a is executed with the same conditions as the first a-ITO layer 202a as described above, so that the a-ITO layer 206a formed above the p-ITO layer 202p is polycrystallized, in two pixel regions (G and R pixel regions) on the right of FIG. 4F. In this manner, a layered structure of the first p-ITO layer 202p and the second p-ITO layer 206p is obtained in the two pixel regions at the right of the drawing as shown in FIG. 5A. After the second a-ITO layer 206a is polycrystallized, the interface between the lower p-ITO layer 202p and the upper p-ITO layer 206p is no longer clear and these layers form a p-ITO layer having a thickness corresponding to the two layers.

Figure 5B:
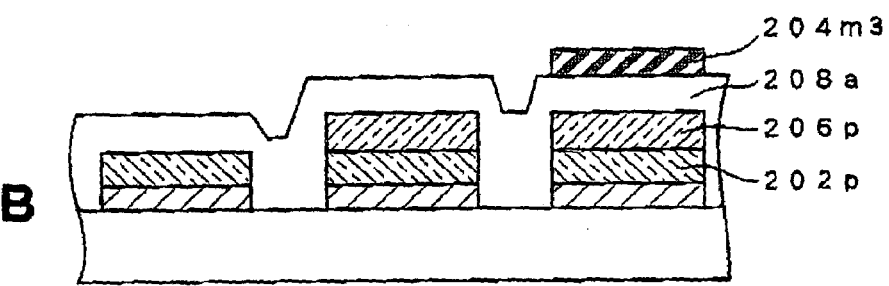
Figure 5C:
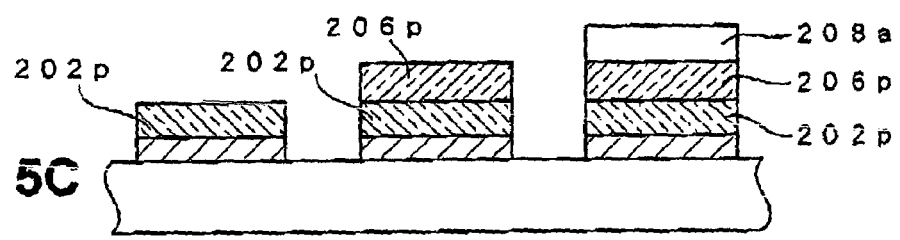

After the second p-ITO layer 206p is formed, an a-ITO layer 208a having a predetermined thickness is formed through sputtering over the entire surface of the substrate covering the p-ITO layer 206p as shown in FIG. 5B. Then, an etching mask 204m3 is formed through photolithography so that the etching mask 204m3 covers only the pixel region in which the a-ITO layer 208a is to remain, in the exemplified configuration, the R pixel region. Using the etching mask 204m3 as a mask, the a-ITO layer 208a is etched with an etchant similar to that described above which can remove the a-ITO layer 208a using the p-ITO as an etching stopper. In this manner, only the a-ITO layer 208a in a region which is not covered by the etching mask 204m3 is selectively removed. In the exemplified configuration, the etching process of the a-ITO layer 208a automatically stops when the lower p-ITO layer 206p is exposed in the G pixel region and when the lower p-ITO layer 202p is exposed in the B pixel region. Then, the etching mask 204m3 is removed so that the third a-ITO layer 208a remains only in the region covered by the etching mask 204m3, that is, the R pixel region as shown in FIG. 5C.

Figure 5D:
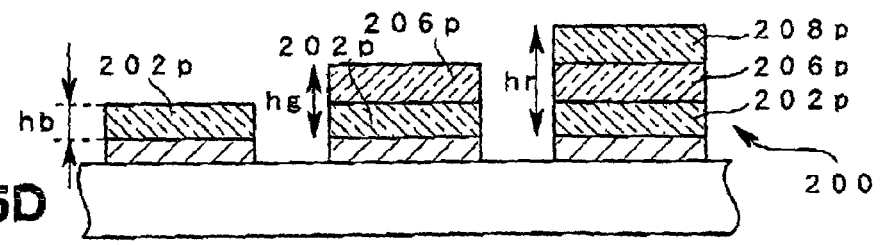

Next, an annealing process for polycrystallizing the a-ITO layer 208a is applied with the same conditions as the polycrystallization processes for the first and second a-ITO layers as described above, and a p-ITO layer 208p is formed on the second p-ITO layer 206p only in the R pixel region as shown in FIG. 5D. Similar to the interface between the first and second p-ITO layers, regarding the interface between the second p-ITO layer 206p and the third p-ITO layer 208p, no trace of the polycrystallization will remain, and therefore, in the R pixel region of the exemplified configuration, an ITO layer is formed having a thickness larger than those in the regions of other colors and which is polycrystallized in the entire layer.

In this manner, in the present embodiment, a final number of layers (a total thickness) of the p-ITO layer is changed by selectively removing an upper a-ITO layer using a lower p-ITO layer as an etching stopper in the pixel regions of R, G, and B having different light emission wavelengths, when the pixel regions are patterned through photolithography. With this structure, it is possible to easily and accurately change the thicknesses $h_r$, $h_g$, and $h_b$ of the conductive resonator spacer layer 200 for R, G, and B as shown in FIG. 5D. Thus, it is possible to form a conductive resonator spacer layer 200 having different thicknesses among R, G, and B using three etching masks (204m1, 264m2, and 204m3) for forming the conductive resonator spacer layer 200 having three thicknesses.

The thicknesses of the first through third ITO layers need not be identical and can be adjusted, for example, by adjusting the film formation time so that the final thicknesses $h_b$, $h_g$, and $h_r$ required in the conductive resonator spacer layer 200 can be achieved by a single layer structure, a two-layer structure, and a three-layer structure in an optimum manner.

More specifically, the thickness of the first p-ITO layer 202p is set at the same thickness as the thickness $h_b$ of the conductive resonator spacer layer 200 required for the B pixel which has the smallest thickness. The thickness of the second p-ITO layer 206p is set to "$h_g$-$h_b$" so as to realize a thickness $h_g$ of the conductive resonator spacer layer 200 required for the G pixel. Finally, the thickness of the third p-ITO layer 208p is set to "$h_r$-$h_g$-$h_b$" so as to realize a thickness $h_r$ of the conductive resonator spacer layer 200 required for the R pixel.

After the conductive resonator spacer layer 200 is formed to different thicknesses corresponding to the different light emission wavelengths, a planarizing insulating layer 140 which is made of, for example, an acrylic resin, is formed covering the ends of the spacer layer 200, and then, an organic light emitting element layer 120 having a light emitting layer is formed and a second electrode 240 which also functions as the upper reflective film is formed common to all pixels, as shown in FIGS. 1 and 2. In this manner, an organic EL element having microresonator structures with different optical lengths L for different light emission wavelengths can be obtained in each pixel.

FIGS. 6A–6F show another example manufacturing method different from that shown in FIGS. 4A–4F and 5A–5D. FIGS. 6–6F show processes after the process of FIG. 4D. That is, in this method, the processes identical to those shown in FIGS. 4A through 4D are first performed. Specifically, an a-ITO layer is formed for each pixel on the lower reflective film 110 and the a-ITO layer is polycrystallized so that a p-ITO layer 202p is formed.

Then, as shown in FIG. 6A, an a-ITO layer 206a is formed over the entire surface of the substrate covering the p-ITO layer 202p. A mask is applied above the a-ITO layer 206a through photolithography so that an etching mask 214m2 remains only in the R pixel region. Next, the a-ITO layer 206a is etched using the etchant as described above which allows the first p-ITO layer 202p to act as an etching stopper.

With this process, the second a-ITO layer 206a remains on the first p-ITO layer 202p only in the R pixel region covered by the etching mask 214m2 and the first p-ITO layer 202p is exposed in the other pixel regions, that is, in the G and B pixel regions. Then, an annealing process is applied to the second a-ITO layer 206a under the same conditions as the polycrystallization annealing process as described above to polycrystallize the a-ITO layer 206a and to obtain a two-layered structure of p-ITO layer 202p and the p-ITO layer 206p only in the R pixel region as shown in FIG. 6C.

Next, as shown in FIG. 6D, a third a-ITO layer 208a is formed over the entire surface of the substrate, and an etching mask 214m3 is formed through photolithography on the a-ITO layer 208a of only some of the pixel regions, in the exemplified configuration, on the G pixel region and the R pixel region. Using an etchant which allows the p-ITO layer at the lower layer to act as an etching stopper, the a-ITO layer 208a is etched and removed. As a result, as shown in FIG. 6E, a structure is obtained in which the third a-ITO layer 208a is layered on the first p-ITO layer 202p in the G pixel region, the third a-ITO layer 208a is layered on the second p-ITO layer 206p in the R pixel region, and only the first p-ITO layer 202p is formed in the B pixel region.

After the third a-ITO layer 208 is patterned, an annealing process is applied to polycrystallize the a-ITO layer 208a. With this process, as shown in FIG. 6F, a structure is obtained in which a p-ITO layer 208p is formed on the p-ITO layer 202p in the G pixel region and the p-ITO layer 208p is formed on the p-ITO layer 206p in the R pixel region. With the method shown in FIGS. 6A–6F also, it is possible to ultimately form a conductive resonator spacer layer 200 having different thicknesses for R, G, and B using three etching masks (204m1 (FIG. 4B), 214m2, and 214m3) for forming the conductive resonator spacer layer 200 having three thicknesses.

In the manufacturing method of FIGS. 6A–6F, the thicknesses of the first through third ITO layers are set as following. Similar to the method described above, the thickness of the first p-ITO layer 202p is set to the thickness $h_b$ of the conductive resonator spacer layer 200 required for the B pixel which has the smallest thickness. The thickness of the third ITO layer 208p is set to a thickness of "$h_g$-$h_b$" so as to achieve a thickness $h_g$ of the conductive resonator spacer layer 200 required for the G pixel. The thickness of the second p-ITO layer 206p is set to a thickness of "$h_r$-$h_g$-$h_b$" so as to achieve a thickness $h_r$ of the conductive resonator spacer layer 200 required for the R pixel.

FIG. 7 shows an example configuration in which the conductive resonators spacer layer 200 in a part of the regions, for example, in the R pixel region which requires the largest thickness among R, G, and B is formed not by a layered structure of ITO layers alone, but by a layered structure of the ITO layer and a light transmissive layer 210 having an index of refraction similar to that of ITO and having a selection ratio with respect to the etchant over the p-ITO layer similar to that of the a-ITO layer. More specifically, a light transmissive layer 210 made of SiNx is formed on the first p-ITO layer 202p and the p-ITO layer 206p is formed on the light transmissive layer 210 so that the conductive resonator spacer layer 200 has a three-layer structure of ITO/SiNx/ITO.

In the configuration of FIG. 7 also, the conductive resonator spacer layer 200 also functions as the first electrode of the organic EL element 100. For this purpose, when a light transmissive layer 210 made of SiNx which is Insulating is to be employed in the spacer layer 200 as shown in FIG. 7, it is necessary that the light transmissive layer 210 does not completely cover the first p-ITO layer 202p. Therefore, a region in which the first p-ITO layer 202p and the second p-ITO layer 206p are directly in contact is provided so as to achieve an electrical conduction between these layers. In this region in which the light transmissive layer 210 is not provided, the optical length L between the lower reflective film 120 and the upper reflective film 240 is shorter than the target length and the intensification wavelength of the microresonator is shifted from the target wavelength. For example, as shown in FIG. 7, by forming the region in which no light transmissive layer 210 is provided and the upper ITO layer and the lower ITO layer contact each other in a region near the ends of the first electrode 200 or near the contact region with the TFT 2, it is possible to connect the upper and lower ITO layers without adversely affecting the area of the light emitting region. For example, in the contact region between the TFT 2 and the first electrode 200, a depression tends to occur at the upper surface of the first electrode 200 due to a contact hole. In a region in which the depression is formed, the optical length L of the microresonator would be different from that in the other regions, and therefore, there is a possibility that light of different wavelengths may mix with the light intensified and emitted in one pixel region. Therefore, it is desirable to set a region in which the optical length L may be different from the target optical length as a non-emissive region. In addition, in order to prevent disconnection of the organic light emitting element layer 120 at the upper layer due to steps at L-e ends of the first electrode 200 and short-circuiting between the second electrode 240 and the first electrode 200 due to these steps, it is desirable to cover the ends of the first electrode 200 with a planarizing insulating layer 140. In other words, the contact region and the ends of the first electrode 200 are covered by the planarizing film 140 and become non-emissive regions. Therefore, because light is not emitted regardless of whether or not the light transmissive layer 210 for adjusting the optical length L is present in these regions, it is possible to form, in these regions, the contact region between the two ITO layers without adversely affecting the light emission wavelength.

FIGS. 8A–8E show a manufacturing method in which the thickness of the conductive resonator spacer layer 200 is changed corresponding to the light emission wavelengths using the insulating light transmissive layer 210 as shown in FIG. 7. The processes for forming a first a-ITO layer on the lower reflective film 110, patterning the first a-ITO layer into a pattern for each pixel, and polycrystallizing to form the p-ITO layer 202p are similar to those shown FIGS. 4A–4D as described above, and will not be described again.

In the manufacturing method exemplified in FIGS. 8A–8E, after the p-ITO layer 202p is formed for each pixel, a light transmissive layer 210 made of SiNx (hereinafter referred to as "SiNx layer") is formed over the entire surface of the substrate covering the p-ITO layer 202p as shown in FIG. 8A. The SiNx layer 210 is formed, for example, through sputtering. Then, a resist material is formed on the SiNx layer 210 and an etching mask 224m2 having a desired pattern is formed through photolithography. In the configuration of FIG. 8A, the etching mask 224m2 is formed only on the SiNx layer 210 in the R pixel region.

Then, regions of the SiNx layer 210 not covered by the etching mask 224m2 are etched. Here, by using an etchant made of, for example, an aqueous solution of hydrofluoric acid, nitric acid, and acetic acid, it is possible to remove the SiNx layer 210 using the p-ITO layer 202p as an etching stopper. In addition, the etching speed of the SiNx layer 210 by such an etchant is faster than the etching speed of the p-ITO layer by a factor of 10 or greater, more specifically, by a factor of several tens. Therefore, similar to the etching of the a-ITO layer, the SiNx layer 210 can be selectively removed from above the p-ITO layer using the p-ITO layer 202p at the lower layer as an etching stopper. By applying such an etching process, the SiN layer 210 remains on the p-ITO layer 202p only in the region in which the etching mask 224m2 is formed and, in the pixel regions which are not masked, the SiN layer 210 is removed and the etching automatically stops when an upper surface of the p-ITO layer 202p is exposed.

After the etching of the SiN layer 210 is completed, the etching mask 224m2 is removed to obtain a structure in which a layered structure of the p-ITO layer 202p and the SiN layer 210 is formed only in the R pixel region which was masked and a single layer structure of the p-ITO layer 202p is formed in the B pixel region and the G pixel region which were not masked, as shown in FIG. 8B.

Next, an a-ITO layer 206a is formed over the entire surface of the substrate covering the SiN layer 210 and the exposed p-ITO layer 202p as shown in FIG. 8C. Then, an etching mask 224m3 is patterned through photolithography so that only a predetermined pixel region remains. In the exemplified configuration of FIG. 8C, the etching mask 224m3 is formed and patterned to cover the a-ITO layer 206a in the G pixel region and the R pixel region.

Next, the a-ITO layer 206a is etched using an etchant which can remove the a-ITO layer 206a with the p-ITO layer 202p as an etching stopper as described above (for example, an aqueous solution of HCl and HNO$_3$) so that the a-ITO layer 206a is removed in the region not covered by the etching mask 224m3 as shown in FIG. 8D, that is, in the exemplified configuration, in the B pixel region. This etching can be stopped when the p-ITO layer 202p is exposed.

Then, an annealing process is applied under the same conditions as the polycrystallization annealing as described above, to polycrystallize the a-ITO layer 206a remaining in the G pixel region and the R pixel region in FIG. 8D to form a p-ITO layer 206p as shown in FIG. 8E. In this manner, an conductive resonator spacer layer 200 having different thicknesses for the R, G, and B pixel regions can be obtained. In the exemplified configuration, the B pixel region has a single layer structure of the p-ITO layer 202p, the G pixel region has a two-layer structure in which the second p-ITO layer 206p is formed on the first p-ITO layer 202p, and the R pixel region has a three-layer structure in which the SiNx layer 210 is formed on the first p-ITO layer 202p and the second p-ITO layer 206p is formed on the SiNx layer 210, and thus, different thicknesses as the conductive resonator spacer layer 200 are obtained in these pixel regions. In the structure in which the lower p-ITO and the upper p-ITO are directly layered such as in the G pixel region, the interface of the layers is not clear after the ITO layers are polycrystallized and one overall polycrystalline ITO layer is obtained.

With this method also, it is possible to form a conductive resonator spacer layer 200 having different thicknesses for R, G, and B through a minimum number of processes while using photolithography having a high positional precision. As described above, because the index of refraction of the SiNx layer 210 is equal to the index of refraction of the p-ITO layer, it is possible to prevent reflection and diffusion of light at the interface.

When the SiN layer 210 is formed directly on the ITO layer through plasma CVD, a portion of the surface of the ITO which is a metal oxide may be colored through reduction. In order to prevent this coloring, it is desirable to form the film through sputtering as described above or to form a very thin film of, for example, an SiO$_2$ film on the ITO layer and then form the SiN layer 210 though plasma CVD. Because the index of refraction of SiO$_2$ is approximately 1.5, some reflection and diffusion of light occurs at the interface between SiO$_2$ and ITO and the interface between SiO$_2$ and the SiN layer 210. However, the difference in the index of refraction is within ±25%, and therefore, significant loss in the amount of light to be emitted is prevented. Moreover, the thin film of SiO$_2$ can be removed simultaneously with the SiNx layer during the etching of the SiNx layer using the lower p-ITO layer as an etching stopper. Therefore, the SiO$_2$ thin film which is insulating does not remain, for example, on the surface of the conductive resonator spacer layer 200 in the B pixel region or in the G pixel region.

In the above description, a color display device which emits light of three colors of R, G, and B has been exemplified. The present invention, however, is not limited to such a configuration and may be applied to a display device, for example, having four or more light emission wavelengths in which pixels of a color or colors other than R, G, and B are provided in addition to R, G, and B pixels. In such a case, 4 or more thicknesses for the conductive resonator spacer layer 200 are realized in one display device corresponding to the demand for the number of light emission wavelengths and whether or not each wavelength is to be intensified. In order to obtain 4 or more thicknesses for the conductive resonator spacer layer 200, it is possible to sequentially use 4 or more etching masks for etching the a-ITO layer and to repeat the process of selectively removing the upper a-ITO layer or SiNx layer using the lower p-ITO layer as an etching stopper.

What is claimed is:

1. A display device comprising a plurality of pixels and which realizes a color display using emitted light of at least two wavelengths, wherein each of the plurality of pixels comprises a microresonator structure formed between a lower reflective film formed on a side near a substrate and an upper reflective film formed above the lower reflective film with an organic light emitting element layer therebetween, the organic light emitting element layer having at least one layer, a conductive resonator spacer layer having an individual pattern for each pixel is provided between the lower reflective film and the organic light emitting element layer, at least the conductive resonator spacer layer provided in a part of the plurality of pixels comprises a plurality of transparent conductive metal oxide layers and a light transmissive layer provided between the transparent conductive metal oxide layers and having an index of refraction with a difference within 25% from an index of refraction of the transparent conductive metal oxide layer, and light obtained in the organic light emitting element layer is intensified by the niicroresonator structure formed between the lower reflective film and the upper reflective film and is emitted to the outside.

2. A display device according to claim 1, wherein
the transparent conductive metal oxide used in the conductive resonator spacer layer is a material which satisfies a condition that an etching rate of the transparent conductive metal oxide in a polycrystalline state with respect to an etching agent for the transparent conductive metal oxide in an amorphous state is less than 1/10 of an etching rate of the amorphous transparent conductive metal oxide with respect to the etching agent for the amorphous transparent conductive metal oxide under same processing conditions, and a condition that an etching rate of the polycrystalline transparent conductive metal oxide with respect to an etching agent for a material of the light transinissive layer is less than 1/10 of an etching rate of the light tranamissive layer with respect to the etching agent for the material of the light transmissive layer under same processing conditions.

3. A display device according to claim 1, wherein
the transparent conductive metal oxide layer of the conductive resonator spacer layer is formed by an indium tin oxide, and
the light transmissive layer is formed by a silicon nitride.

4. A display device according to claim 1, wherein
the lower reflective film contains silver, gold, platinum, aluminum, or an alloy of any of these metals.

5. A display device according to claim 1, wherein
the conductive resonator spacer layer is an electrode which is provided between the lower reflective film and the organic light emitting element layer and which supplies charges to the organic light emitting element layer.

6. A display device according to claim 1, wherein
the conductive resonator spacer layer is an electrode which is provided between the lower reflective film and the organic light emitting element layer and which supplies charges to the organic light emitting element layer.

7. A display device comprising a plurality of pixels and which realizes a color display using emitted light of at least two wavelengths, wherein
each of the plurality of pixels comprises a microresonator structure formed between a lower reflective film formed on a side near a substrate and an upper reflective film formed above the lower reflective film with an organic light emitting element layer therebetween, the organic light emitting element layer having at least one layer, a conductive resonator spacer layer having an individual pattern for each pixel is provided between the lower reflective film and the organic light emitting element layer, at least the conductive resonator spacer layer provided in a part of the plurality of pixels comprises a single layer or a plurality of transparent conductive metal oxide layers, the conductive resonator spacer layer provided in pixels other than the part of the plurality of pixels and having a light emission wavelength different from the part of the plurality of pixels comprises a plurality of transparent conductive metal oxide layers and a light transmissive layer provided between the transparent conductive metal oxide layers and having an index of refraction with a difference within 25% from an index of refraction of the transparent conductive metal oxide layer, and light obtained in the organic light emitting element layer is intensified by the microresonator structure formed between the lower reflective film and the upper reflective film and is emitted to the outside.

* * * * *